United States Patent [19]

Suzuki et al.

[11] Patent Number: 5,075,718
[45] Date of Patent: Dec. 24, 1991

[54] EXPOSURE APPARATUS

[75] Inventors: Shigeru Suzuki, Tachikawa; Kazuya Tanaka, Yokohama; Manabu Gotoh, Yokohama, all of Japan

[73] Assignee: Ushio Denki, Tokyo, Japan

[21] Appl. No.: 617,106

[22] Filed: Nov. 21, 1990

[30] Foreign Application Priority Data

Feb. 21, 1990 [JP] Japan .................................. 2-38387

[51] Int. Cl.⁵ ................... G03B 27/48; G03B 27/50; G03B 27/74; G03B 27/80
[52] U.S. Cl. ........................................ 355/50; 355/68
[58] Field of Search .................... 355/27, 28, 50, 51, 355/68

[56] References Cited

U.S. PATENT DOCUMENTS

| 3,557,675 | 1/1971 | Koll | 355/28 X |
| 3,901,590 | 8/1975 | Ashida et al. | 352/14 |
| 4,099,862 | 7/1978 | Bickl et al. | 355/68 X |
| 4,136,946 | 1/1979 | Nishimoto | 355/28 |
| 4,188,112 | 2/1980 | Hamilton | 355/50 |
| 4,447,146 | 5/1984 | Kogane et al. | 355/28 |
| 4,565,442 | 1/1986 | Benker et al. | 355/68 |
| 4,655,583 | 4/1987 | Kitai et al. | 355/29 |
| 4,727,399 | 2/1988 | Matsumoto | 355/68 X |
| 4,837,601 | 6/1989 | Nakane et al. | 355/28 |

FOREIGN PATENT DOCUMENTS 64-69445 3/1989 Japan .

Primary Examiner—Richard A. Wintercorn
Attorney, Agent, or Firm—Armstrong, Nikaido, Marmelstein, Kubovcik & Murray

[57] ABSTRACT

With an exposure apparatus according to the present invention, it is possible to project an image of a mask in a any large number onto a band-shaped film sequentially in a longitudinal direction with high precisions in position, magnification and focus. Thus, the apparatus can be provided for fabrication of an FPC film of a high circuit density.

5 Claims, 2 Drawing Sheets

EXPOSURE APPARATUS

BACKGROUND OF THE INVENTION

1. Field of the Invention

The present invention relates to an exposure apparatus for fabrication of a printed circuit board, for example, for use in mounting or assembling of electronic parts.

2. Description of the Prior Art

Those known and commonly called printed circuit boards include printed wire boards (which will be referred to as PWB herein below) used in computers, television sets, stereos, etc., and flexible printed circuit boards (which will be referred to as FPC herein below) used in cameras, table calculators, UTRs, etc., but the present invention relates to an exposure of a band-shaped flexible film of FPCs, such as a film carrier tape used in a package of electronic parts in a method of TAB (Tape Automated Bonding) type. To fabricate a printed circuit board, a thin photo-resist layer such as a liquid resist and a dry film resist is mounted on a substrate, and a desired pattern is formed on the photoresist layer through a step of exposing the photo-resist to light at a wavelength effective for photo-sensitization of the photo-resist through a photo-mask having a pattern drawn thereon.

In this case, there are known methods of two types: a close-contact type and a proximity type from a difference in positional relations of the substrate with the photo-mask. The former is an exposure method in which a substrate having a photo-resist mounted thereon and a photo-mask are disposed in a close-contact relation, whereas the latter is an exposure method in which a substrate and a photo-resist are disposed at a small given distance spaced apart from each other. The magnifications of the photo-mask and the pattern to be exposed in the methods of the two types are substantially the same.

Recently, however, as in ICs and the like, a reduction in size of the pattern eve in the printed board is being demanded with increasing in precision of parts and device having a printed board incorporated therein. For example, in a printed board of FPC used in a table calculator, a clock and the like, a width of each wire in a pattern within a range of about 100 to 50 $\mu$m is demanded. In an exposure of a film carrier tape required for assembling of a semiconductor device in the method of TAB type which is recently prospering, an exposure at a width of each wire, for example, about 5 $\mu$m, is demanded. The exposure methods of the two types given herein as the prior art methods have problems in following respects.

First, in the prior art methods of close-contact type and proximity type employing the same magnification as described above, and with reduction in size of a printed board to be fabricated, a very small photo-mask must be also prepared in proportion to such reduction in size. This makes the fabrication of the printed board difficult and causes an increase in cost.

Secondly, in the method of such proximity type, it is required for a surface on which the photo-resist layer is mounted and the photo-mask to have the same gap at any place therebetween; i.e., the parallelism is required, but the precision of parallelism cannot be increased in any way due to a warpage of the photo-mask or the like. Consequently, the image exposed may be distorted, resulting in an obstruction to the reduction in size. In serious case, the photo-mask may be brought into contact with the photo-resist and fouled or flawed, causing a defective product as in the method of the close-contact type.

Thereupon, as in the exposure method for the manufacture of ICs, the employment of a projection method has been recently reviewed even in an exposure method for fabrication of printed boards. This is because the projection method has advantages that even if the printed board to be fabricated is reduced in size, a photo-mask can be produced at available dimensions and then subjected to an exposure in a scaling-down manner to provide an image of a desired size, and that a fear of fouling or flawing due to a distortion of the photo-mask is also eliminated.

With the projection method, however, an optical aligning operation such as adjustment of the focus of an image to the photo-mask on an exposure plane is of course required. More specifically, if the photo-mask was not fabricated with a size and a precision according to a design, or the position of an original picture is not exact, an off-focusing or misalignment in position of an image with respect to the original picture may be produced in the exposure plane and hence, it is necessary to correct such phenomenon.

Even with regard to the width of each wire exposed in the printed board, there are also boards requiring an exposure of a precision of a very small gap on the order of 5 $\mu$m in a case of a film carrier tape for TAB, and an optical aligning technique of a considerably high precision although not covering the order in an exposure for LSIs and VLSIs is required.

As described above, in order to adjust the off-focusing and misalignment in position of an image to the photo-mask on the exposure plane, the exposure system of the projection type has a technical subject that a means for monitoring a situation of formation of the image on the film being exposed is required and such means must be a monitoring means having a higher precision with a reduction in width of wire exposed.

On the other hand, among FPC films, there is also a printed circuit board which is made using a band-shaped film such as a film carrier tape for TAB as an insulting substrate, by forming a circuit on the film frame by frame in a longitudinal direction and cutting the film frame by frame to provide a single FPC film board.

In exposure for fabrication of such a FPC film, a mechanism for step-feeding the band-shaped film frame by frame is of course required. In this case, what needed for the exposure system of the projection type is to project an image of a pattern of a mask to be transferred, at an exact position on the film with an exact size (magnification) without off-focusing and hence, it is necessary to conduct the above-described adjustment so that the image of the pattern of the mask may be projected at a predetermined position with an exact size (magnification) without off-focusing and to locate one frame (area to be exposed) of the film to be exposed at such predetermined position Therefore, there is a subject that after the above-described step-feeding, one frame of the film must be stopped with a required high precision at the predetermined position in which an image of the photo-mask is formed.

SUMMARY OF THE INVENTION

The present invention has been accomplished with the above subject in view, and it is an object of the present invention to provide an exposure apparatus for fabricating an FPC film frame by frame from a band-shaped film, wherein a projection method is employed to meet the need of a reduction in size of pattern and an exposure can be effected with high precisions of position, size and focusing of a projected image relative to a film, thereby producing an FPC film of a high circuit density.

To achieve the above object, an exposure apparatus according to the present invention is for transferring a pattern of a mask in any large number onto a band-shaped film sequentially in a longitudinal direction and comprises a light source, an illumination monitor for detecting a light output from the light source, a shutter, a mask irradiated with light from the light source, a position adjusting mechanism for adjusting the position of the mask, a projection lens for coupling light transmitted through the mask onto an exposure plane and projecting an image of a pattern of the mask, a projection lens position adjusting mechanism for adjusting the position of the projection lens, a means for monitoring a projected image, a film feed mechanism for successively step-feeding an exposure area of the band-shaped film onto which the pattern of the mask is transferred by one run of exposure, a film feed quantity monitor for detecting the quantity of film fed by the film feed mechanism, means for locating the surface of the fed exposure area at an exact position within a plane on which the image of the pattern of the mask is formed by the projection lens, a film holding means for holding the exposure area at the position during exposure, a film supply means for supplying the film to the film feed mechanism after bringing it into a loosened state subjected to no tension, a means for detecting the amount of film loosened on a supply side, a film recovery means for recovering the exposed film after bringing it into a loosened state subjected to no tension, a means for detecting the amount of film loosened on a recovery side, and a control means, the control means being adapted to effect a control of the opening and closing of the shutter at least by a preset exposure time, a signal from the illumination monitor and a signal from the film feed quantity monitor, a control of the step feeding by the film feed mechanism in accordance with the preset exposure time and the length of the exposure area, a control of the amount of film supplied by the film supply means by a signal from the means for detecting the amount of film loosened on the supply side, and a control of the quantity of film recovered by the film recovery means by a signal from the means for detecting the amount of film loosened on the recovery side.

It is desirable that the means for monitoring the projected image comprises a half-transparent thin membrane disposed at a position to receive the light reflected from the exposure plane and a microscope disposed at a position to receive the light reflected from the half-transparent thin membrane. In addition, it is preferable that among the locating means, the means for locating the surface on a plane perpendicular to an optical axis is pins adapted to be fitted into perforations in the film, and the means for locating the surface in a direction of the optical axis is a film retaining plate for retaining the film urged up in the direction of the optical axis. Further, it is preferable that the film holding means is a stage having vacuum attracting holes.

With the above construction, it is possible to project the image of the mask onto the band-shaped film with a good precision to expose the film.

The above and other objects, features and advantages of the invention will become apparent from a reading of the following description of the preferred embodiment, taken in conjunction with the accompanying drawings.

DESCRIPTION OF THE PREFERRED EMBODIMENT

The present invention will now be described by way of one embodiment with reference to the accompanying drawings.

Figure 1:
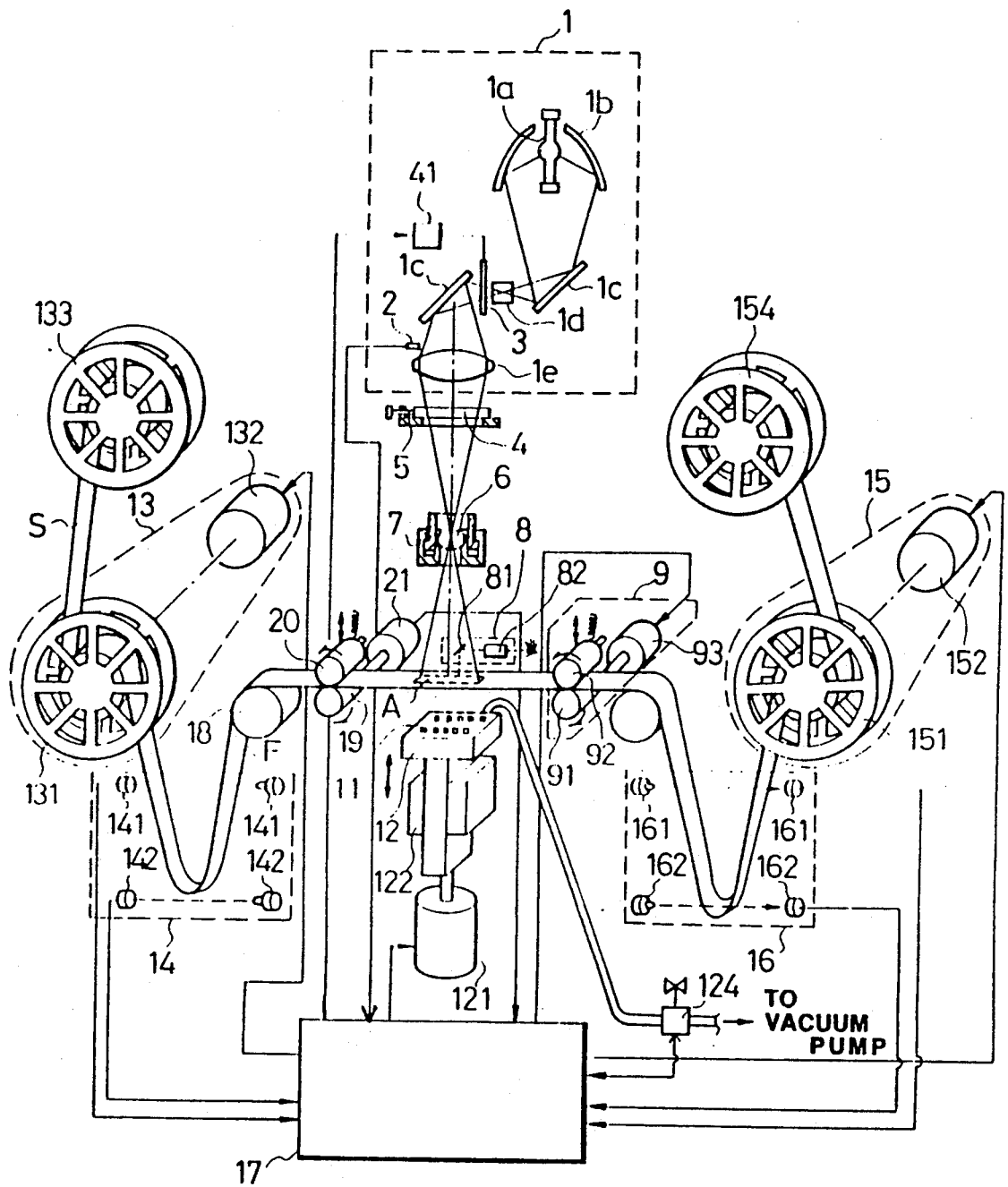
FIG. 1 is a view of an exposure apparatus according to one embodiment of the present invention.

FIG. 1 is a view of an exposure apparatus according to one embodiment of the present invention, and FIG. 2 is a view of a positioning means shown in FIG. 1.

In FIGS. 1 and 2, reference numeral 1 designates a light source, and reference numeral 2 designates an illumination monitor. Reference numeral 3 is a shutter; reference numeral 4 being mask; 5 being a mask position adjusting mechanism; 6 being a projection lens; 7 being a projection-lens position adjusting mechanism; 8 being a projected-image monitoring means; 9 being a film feed mechanism; 10 being a means for location in a direction of the optical axis; 11 being a means for location on a plane perpendicular to an optical axis; 12 being a film holding means; 13 being a film supply means; 14 being a means for detecting the amount of film loosened on a supply side; 15 being a recovery means; 16 being a means for detecting the amount of film loosened on a recovery side; and 17 being a control means.

Referring to FIG. 1, light emitted from the light source 1 illuminates the mask 4, and the light which has illuminated the mask 4 is partially transmitted through the mask 4 to enter the projection lens 5 and coupled to an exposure area of the film F by the projection lens 5, thereby projecting a pattern of the mask 4.

The light source 1 is comprised of a lamp 1a, an oval light-collecting mirror 1b, a planar mirror 1c, an integrator lens 1d and a condenser lens 1e. The lamp 1a used may be a lamp having a higher brightness such as a ultra-high pressure mercury lamp which discharges a large number of i-, h- and g-beams and includes a resist applied on a surface of the film F and having a sensitivity.

The lamp 1a is disposed so that the position of its arc is at a first focus of the oval light-collecting mirror 1b. The integrator lens 1d is intended to increase the uniformity of light emitted from the light source 1 and is disposed at a location corresponding to a second focus of the oval light-collecting mirror 1b. The integrator lens 1d is also called a fly eye lens and includes a rod lens type or a twin-lens type. Thus, light having a higher illumination and a higher uniformity is emitted from the light source 1.

In order to form a distinct image of an exact size at an exact location on the exposure area of the film, it is necessary to establish a certain surface as a reference plane, so that the pattern of the mask is projected at an exact location on the reference plane with an exact magnification without any off-focusing, and to precisely position the surface of the exposure area of the film on the reference plane. Therefore, what required for the exposure system is an optical alignment and a positioning of the exposure area of the film.

First, the optical alignment is conducted prior to the operation of the exposure apparatus. In this embodiment, the reference plane is established on a lower surface 101 of a film retaining plate 10 serving as the means for location in the direction of the optical axis, as shown in FIG. 2, and the positions of the mask 4 and the projection lens 6 are adjusted, so that an image of the pattern of the mask 4 is precisely projected onto the reference plane Specifically, a sample film is first urged onto and retained on the lower surface 101 of the film retaining plate 10 by a stage 12 and thus positioned thereon, as will be described hereinafter. In this condition, light from the light source 1 is coupled onto the sample film though the mask 4 by the projection lens 6. Then, an image projected on the sample film is monitored by the monitoring means 8 which is comprised of a thin half-transparent thin film 81 and a microscope 82. More specifically, light reflected from the film is reflected on the half-transparent thin film 81 and taken up to enter the microscope 82, while observing the focus and the magnification of the image on the sample film through the microscope 82, the mask position adjusting mechanism 5 and the projection lens position adjusting mechanism 7 are operated to perform the optical alignments for the image such as the alignment of the position, adjustment of the magnification and focus. To provide a higher precision monitoring of the image, it is desirable that the half-transparent thin film 81 is of 2 μm of less. It is also possible to use a TTL type used in a stepper.

The mask position adjusting mechanism 5 used may be one which is adjustable in position at least in the direction of the optical axis and a plane perpendicular to the optical axis. Likewise, the projection lens position adjusting mechanism 7 used may be one which is adjustable in position at least in the direction of the optical axis and within a plane perpendicular to the optical axis.

The positioning of the exposure area A of the film is conducted for every step-feeding of the film. An example of exposure using the exposure system of the present embodiment will be described below.

The film F is usually rolled with a spacer S overlapped thereon. As shown in FIG. 1, the film supply means 13 comprised of the film supply reel 131 and a film supply reel driving motor 132 is used, and the motor 132 is driven to deliver the film F from the film supply reel 131. The spacer S is recovered onto a spacer recovery reel 133.

The film F delivered from the film supply reel 131 is brought into a loosened state subjected to no tension, as shown in FIG. 1 and then stepwise fed via an auxiliary roller 18 and a sprocket roller 19 and the like by the film feed mechanism 9. The reason why the film F is brought into a loosened state subjected to no tension is that no influence is exerted on the precision of a stop position after step-feeding by the feed mechanism.

Here, the amount of film F loosened is detected by the loosened-amount detecting means 14 comprising two photo-sensors 141 and 142, and the film supply reel driving motor 132 is driven by a signal from the control means 17 which has received a signal from the detecting means 14. Specifically, when the upper photo-sensor 141 has been turned on to judge that the looseness of the film has been reduced, a driving signal is supplied from the control means 17 to the film supply reel driving motor 132. When the lower photo-sensor 142 has been turned off to decide that the looseness of the film has reached a predetermined amount, a stopping signal is delivered from the control means 17.

The film feed mechanism 9 comprises a feed roller 91, a retaining roller 92, and a feed roller driving motor 93. The film F is retained in a pressed manner by the feed roller 91 and the retaining roller 92 and fed under a friction force by the feed roller 91 rotated by the roller driving motor 93. The distance of feed by the feed roller 91 may be determined depending upon the length of the exposure area A. This distance has been previously inputted to the control means 17 and is delivered as a control signal from the control means 17 to the feed roller driving motor 93. For example, the feed roller 91 is a pulse motor, and a pulse signal is delivered from the control means 17.

Only the control of the distance of feed by the feed roller 91 results in an inferior precision of the stop position because of an inferior precision of the feed direction. Thereupon, the sprocket roller 19 is mounted at a predetermined location to regulate the feed direction. The retaining roller 20 holds down the film F so that pins of the sprocket roller 19 are fitted into perforations in the film F. It should be noted that a feed distance monitor 21 such as a rotary encoder is mounted on a shaft of the sprocket roller 19, so that a signal from the feed distance monitor 21 is delivered to the control means 17. If the film is not retained in a pressed manner by the feed roller 91 and the retaining roller 92 and is slipped, the feeding is judged to be abnormal on the basis of a signal from the feed distance monitor 21, and the subsequent operation is stopped.

Figure 2A:
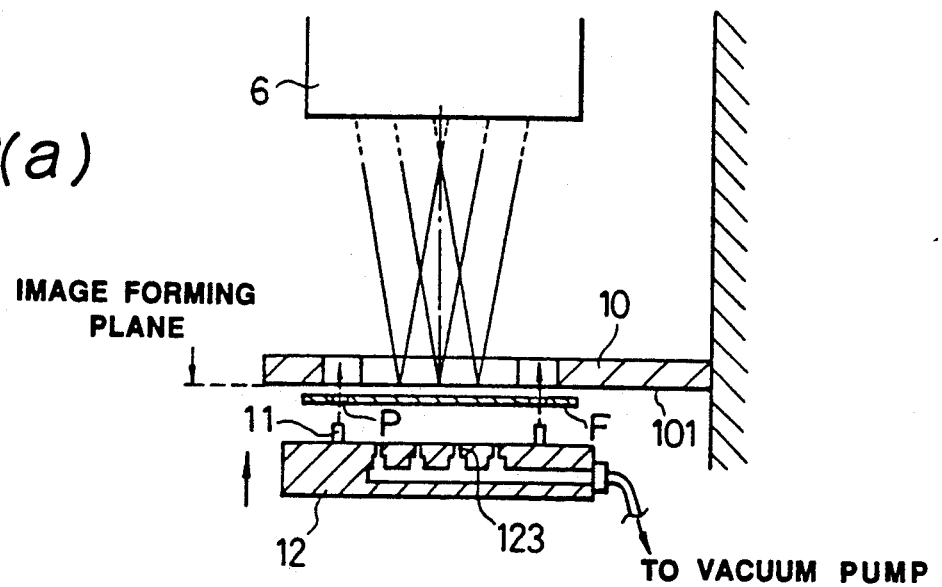
FIG. 2a is a sectional view of a locating means shown in FIG. 1, taken in a direction of an optical axis.
Figure 2B:
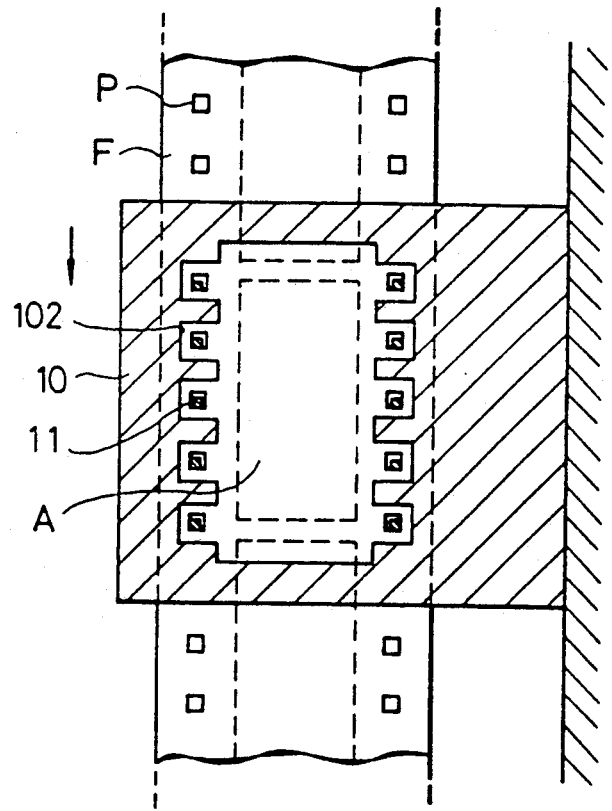
FIG. 2b is a plan view of the locating means, taken in a plane perpendicular to the optical axis

FIG. 2 is a view of the locating means shown in FIG. 1, FIG. 2a being a section view taken in the direction of the optical axis, and FIG. 2b being a plan view taken in a plane perpendicular to the optical axis.

If the exposure area A is fed to the below of the reference plane which is an image forming plane by the film feed mechanism 9 and stopped thereat, a stage 12 as the film holding means is raised by the operation of a stage lift source (e.g., an air cylinder) 121 shown in FIG. 1, and pins 11 as the locating means mounted on the stage 12 on a plane perpendicular to the optical axis are fitted into perforations P to perform the locating on the plane perpendicular to the optical axis. The pins 11 are mounted at predetermined places relative to the optical axis, and a locating of a higher precision is provided by a linear guide 122 such as a cross roller guide having a higher precision of linearity.

Even after fitting of the pins 11 into the perforations, the stage 12 continues to be raised, thereby urging the exposure area of the film upwardly against the film retaining plate 10. This achieves the locating of the surface of the exposure area A of the film in the direction of the optical axis, so that the surface of the exposure area A of the film is exactly disposed on the image forming plane. In this case, the film retaining plate 10 is provided with U-shaped notches 102 for permitting the raised pins 11 to be escaped thereinto, as shown in FIG. 2b.

In this condition, a valve 124 is opened in response to a signal from the control means 17, and a vacuum attracting holes 123 in the stage 12 attracts and holds the exposure area A of the film in an evacuating manner.

The motion of vacuum attraction of the film is monitored by a pressure sensor (not shown) mounted in a vacuum system. If a signal from the pressure sensor is fed to the control means 17 to judge that the exposure area A has been retained exactly, the control means 17 delivers a shutter-opening signal to the shutter driving source 41, so that the shutter 4 is opened to start an exposure. The time of exposure of one exposure area A depends upon the type, the thickness and the illumination of an applied resist and may be on the order of 1 to 5 seconds. The exposure time has been previously inputted to the control means 17, and after a lapse of a predetermined time, the shutter-opening signal is supplied from the control means 17 to the shutter driving source 41 to close the shutter 4. A light output from the light source 1 is monitored by the illumination monitor 2, and a light output signal is delivered to the control means 17. If the illumination is reduced due to any cause, the control means 17 conducts an arithmetic processing for prolonging the previously inputted exposure time by a give time in response to the reduction in illumination, so that a shutter-closing signal is supplied in the prolonged exposure time. That is, an integrating light quantity control is conducted.

After closing of the shutter, urging by the retaining rollers 20 and 92 is released and then, a step-feeding signal is supplied from the control means 17 to the feed roller driving motor 93 to permit the step-feeding of the film over the predetermined distance. The thus-fed film F is brought into a loosened state subjected to no tension, as shown in FIG. 1 and thereafter, is recovered by the film recovery means 15 comprising a film recovery reel 151 and a film recovery roller driving motor 152. The reason why the film is once brought into the loosened state subjected to no tension is that the driving of the film recover reel 151 exerts no influence on the stop position of the exposure area as in the feed side. Likewise, the loosened amount is detected by the loosened amount detecting means 16, and the film recovery reel 151 is driven in response to a signal from the detecting means 16. It should be noted that the film F is rolled with the spacer S overlapped thereon to protect the surface of the exposed film F.

As apparent from the above description, the control means 17 comprises a system computer which includes an input section into which a necessary numerical value is previously inputted, an arithmetic processing section for processing the inputted numerical value and the signals from the detecting means, and a memory section.

Although the film supply means 13 and the film recovery means 15 have been shown as comprising the reel and the driving motor respectively in the present embodiment, it will be understood that they may be incorporated, in some cases, in line with devices at proceeding and succeeding steps such as a resist applying device and a developing device. In such case, the means for feeding the film from the device at the proceeding step is the film supply means, and the means for feeding the film to the device at the succeeding step is the film recovery means.

What is claimed is:

1. An exposure apparatus for transferring a pattern of a mask in any large number onto a band-shaped film sequentially in a longitudinal direction, comprising
   a light source,
   an illumination monitor for detecting a light output from the light source,
   a shutter,
   a mask irradiated with light from said light source,
   a position adjusting mechanism for adjusting the position of said mask,
   a projection lens for coupling light transmitted through said mask onto an exposure plane and projecting an image of a pattern of the mask,
   a projection lens position adjusting mechanism for adjusting the position of the projection lens,
   a means for monitoring a projected image,
   a film feed mechanism for successively step-feeding an exposure area of the band-shaped film onto which the pattern of the mask is transferred by one run of exposure,
   a film feed quantity monitor for detecting the quantity of film fed by the film feed mechanism,
   means for locating the surface of the fed exposure area at an exact position within a plane on which the image of the pattern of the mask is formed by the projection lens,
   a film holding means for holding said exposure area at the position during exposure,
   a film supply means for supplying the film to the film feed mechanism after bringing it into a loosened state subjected to no tension,
   a means for detecting the amount of film loosened on a supply side,
   a film recovery means for recovering the exposed film after bringing it into a loosened state subjected to no tension,
   a means for detecting the amount of film loosened on a recovery side, and
   a control means,
   said control means being adapted to effect at least
   a control of the opening and closing of the shutter by a preset exposure time, a signal from the illumination monitor and a signal from the film feed quantity monitor,
   a control of the step-feeding by the film feed mechanism in accordance with the preset exposure time and the length of the exposure area,
   a control of the amount of film supplied by the film supply means by a signal from the means for detecting the amount of film loosened on the supply side, and
   a control of the quantity of film recovered by the film recovery means by a signal from the means for detecting the amount of film loosened on the recovery side.

2. An exposure apparatus according to claim 1, wherein said means for monitoring the projected image comprises a half-transparent membrane disposed in a position to receive the light reflected from the exposure plane, and a microscope disposed in a position to receive the light reflected from said half-transparent membrane.

3. An exposure apparatus according to claim 1, wherein among said locating means, the means for location in a plane perpendicular to an optical axis is pins adapted to be fitted into perforations in the film.

4. An exposure apparatus according to claim 1, wherein among said locating means, the means for locating the surface in a direction of the optical axis is a film retaining plate for retaining the film urged up in the direction of the optical axis.

5. An exposure apparatus according to claim 1, wherein said film holding means is a stage having vacuum attracting holes.

* * * * *